(12) United States Patent
Fukuhara et al.

(10) Patent No.: US 7,685,556 B2
(45) Date of Patent: Mar. 23, 2010

(54) MASK DATA CORRECTION METHOD, PHOTOMASK MANUFACTURING METHOD, COMPUTER PROGRAM, OPTICAL IMAGE PREDICTION METHOD, RESIST PATTERN SHAPE PREDICTION METHOD, AND SEMICONDUCTOR DEVICE MANUFACTURING METHOD

(75) Inventors: Kazuya Fukuhara, Tokyo (JP); Daisuke Kawamura, Yokohama (JP); Shoji Mimotogi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 458 days.

(21) Appl. No.: 11/062,437

(22) Filed: Feb. 23, 2005

(65) Prior Publication Data

US 2005/0188341 A1    Aug. 25, 2005

(30) Foreign Application Priority Data

Feb. 23, 2004    (JP) ............................. 2004-046750

(51) Int. Cl.
G06F 17/50    (2006.01)
(52) U.S. Cl. .............................. 716/19; 716/20; 716/21
(58) Field of Classification Search ............... 716/19–21
See application file for complete search history.

(56) References Cited

U.S. PATENT DOCUMENTS

| | | | | |
|---|---|---|---|---|
| 5,644,390 A | * | 7/1997 | Yasuzato | 356/121 |
| 5,736,280 A | | 4/1998 | Tsudaka | |
| 5,801,821 A | | 9/1998 | Borodovsky | |
| 6,042,257 A | * | 3/2000 | Tsudaka | 700/121 |
| 7,116,411 B2 | * | 10/2006 | Park et al. | 356/124 |
| 7,302,090 B2 | * | 11/2007 | Kalus et al. | 382/145 |
| 2004/0133872 A1 | | 7/2004 | Fukuhara et al. | |

FOREIGN PATENT DOCUMENTS

| | | |
|---|---|---|
| CN | 1396494 A | 2/2003 |
| JP | 8-148404 | 6/1996 |
| JP | 9-34097 | 2/1997 |
| JP | 2000-232057 | 8/2000 |
| JP | 2001-60540 | 3/2001 |
| JP | 2002-329653 | 11/2002 |
| JP | 2003-37050 | 2/2003 |
| JP | 2004-14764 | 1/2004 |

OTHER PUBLICATIONS

Renwick et al.; "Influence of Laser Spatial Parameters and Illuminator Pupil-Fill Performance on the Lithographic Performance of a Scanner"; Proc. SPIE, vol. 4691, pp. 1401-1411, (2002)
K. Sato et al., "Measurement of effective source shift using a grating-pinhole mask," Optical Microlithography XII, Proceedings of SPIE (Mar. 17-19, 1999), 3679:99-107.
Notification of the First Office Action from the State Intellectual Property Office of the People's Republic of China, dated Dec. 8, 2006.
Notification of Reasons for Rejection from the Japanese Patent Office, dated Apr. 1, 2008.

* cited by examiner

*Primary Examiner*—Vuthe Siek
*Assistant Examiner*—Brandon W Bowers
(74) *Attorney, Agent, or Firm*—Finnegan, Henderson, Farabow, Garrett & Dunner, L.L.P.

(57) ABSTRACT

According to an aspect of the invention, there is provided a mask data correction method used when forming a photomask used in a photolithography process, comprising correcting mask data on the basis of simulation performed by using information including nonuniformity of an illumination luminance distribution in an exposure apparatus which uses the photomask formed by using the mask data obtained by the correction result.

17 Claims, 10 Drawing Sheets

In units of nm

| | Pattern pitch | 325 | 400 | 500 | 800 | 2000 |
|---|---|---|---|---|---|---|
| Fitting residual | Predicted from design value | 10.2 | 4.13 | 4.62 | 7.58 | 5.62 |
| | Measurement value | 5.23 | 3.16 | 2.42 | 4.09 | 3.19 |

```
    x          y       Relative luminance
 -1.0000   -1.0000    0.0000
 -0.9765   -1.0000    0.0000
 -0.9529   -1.0000    0.0000
 -0.9294   -1.0000    0.0000
 -0.9059   -1.0000    0.0000
 -0.8824   -1.0000    0.0000
 -0.8588   -1.0000    0.0000
 -0.8353   -1.0000    0.0000
 -0.8118   -1.0000    0.0000
     :         :         :
  0.0353   -0.6471    1.0000
  0.0588   -0.6471    0.9231
  0.0824   -0.6471    1.0000
  0.1059   -0.6471    0.9231
  0.1294   -0.6471    0.9231
  0.1529   -0.6471    0.9231
  0.1765   -0.6471    0.9231
  0.2000   -0.6471    0.9231
  0.2235   -0.6471    0.9231
     :         :         :
```

FIG. 9

| Number | Polynomial |
|---|---|
| 2 | $2\rho \cos\phi$ |
| 3 | $2\rho \sin\phi$ |
| 4 | $\sqrt{3}(2\rho^2-1)$ |
| 5 | $\sqrt{6}\rho^2 \cos 2\phi$ |
| 6 | $\sqrt{6}\rho^2 \sin 2\phi$ |
| 7 | $\sqrt{8}(3\rho^3-2\rho)\cos\phi$ |
| 8 | $\sqrt{8}(3\rho^3-2\rho)\sin\phi$ |
| 9 | $\sqrt{5}(6\rho^4-6\rho^2+1)$ |

$$\rho = \sqrt{x^2+y^2}$$
$$\phi = \tan^{-1}\frac{y}{x}$$

FIG. 10

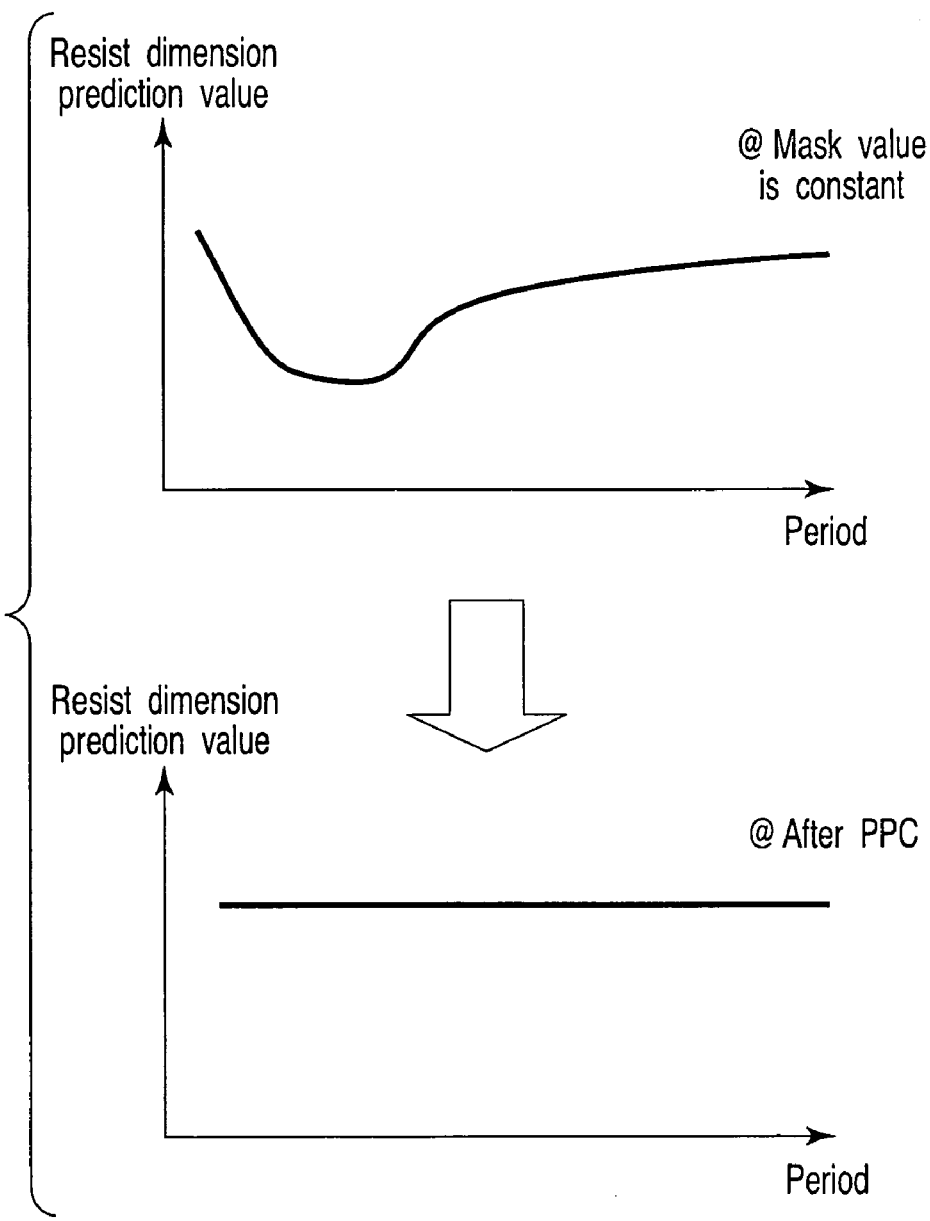
F I G. 13

MASK DATA CORRECTION METHOD, PHOTOMASK MANUFACTURING METHOD, COMPUTER PROGRAM, OPTICAL IMAGE PREDICTION METHOD, RESIST PATTERN SHAPE PREDICTION METHOD, AND SEMICONDUCTOR DEVICE MANUFACTURING METHOD

CROSS-REFERENCE TO RELATED APPLICATIONS

This application is based upon and claims the benefit of priority from prior Japanese Patent Application. No. 2004-046750, filed Feb. 23, 2004, the entire contents of which are incorporated herein by reference.

BACKGROUND OF THE INVENTION

1. Field of the Invention

The present invention relates to a mask data correction method used for manufacturing a photomask used in photolithography in a semiconductor device manufacturing process, a photomask manufacturing method, and a computer program. Also, the present invention relates to an optical image prediction method of predicting an optical image formed by photolithography, a resist pattern shape prediction method, and a semiconductor device.

2. Description of the Related Art (First Background Art)

Recently, in a semiconductor device, along with the requirement for a higher density, higher operation speed, and lower power consumption, a circuit pattern has been micropatterned. Therefore, in the semiconductor device manufacturing process, pattern dimensions must be controlled at high precision.

In the semiconductor device manufacturing process, a resist film is formed on a target film on which a circuit is to be formed. This resist film is irradiated with radiation to form a resist pattern, and the resist pattern serves as a sacrificial film to process the target film. As the radiation, the i ray (365 nm) of a mercury lamp, KrF laser (248 nm), ArF laser (193 nm), and the like are used. Generally, reduction-projection exposure is performed on the resist film through a photomask using ultraviolet to deep-ultraviolet light.

A projection exposure apparatus includes a combination of a large number of lenses. Some projection exposure apparatuses have a numerical aperture (NA) of nearly 0.8 on the incident side of a projection lens. However, because of an optical proximity effect (OPE), the light intensity distribution on a mask is different from that on a transferred wafer image.

Also, since a photochemical reaction which occurs when the resist film absorbs projection light, and a resolution reaction and dissolution reaction into a developing solution accompanying this photochemical reaction have nonlinear characteristics with the projection light intensity, a mask image is different from a resist pattern. The combination of this effect and the optical proximity effect is called a process proximity effect (PPE). Furthermore, since a manufacturing process such as a reactive ion etching (RIE) is performed, a target film pattern is different from a mask pattern.

Therefore, simulation is performed in consideration of the influences of the optical proximity effect and/or a resist process, or the manufacturing process, and then mask data correction called optical proximity correction (OPC) or process proximity correction (PPC) is performed to correct a mask shape so that the resist pattern or the target film pattern has a predetermined shape.

In the mask data correction process, the simulation is performed by using information which represents the characteristics of the projection exposure apparatus. As the characteristics of the projection exposure apparatus, the NA, an illumination coherency σ, a ring shielding ratio (or annular illumination shape), a projection magnification, and the like are generally used. Note that reference symbol σ denotes the ratio between the NA on the exit side of an illumination optical system and the NA on the incident side of the projection lens, which represents the size of an illumination light source.

In consideration of the resist process or the manufacturing process, a process parameter for describing the process is acquired by using shape information (typically, dimensional information) acquired from an experimentally-formed pattern. Then, by using a simulation parameter, the mask data is changed to acquire a predetermined pattern on a substrate.

Note that Jpn. Pat. Appln. KOKAI Publication No. 2002-329653 discloses a technique for measuring and correcting illuminance nonuniformity (illuminance deviation) in the exposure area of the exposure apparatus, to improve the precision of the micropattern.

(Second Background Art)

The illumination luminance distribution of the exposure apparatus is closely related to a resist pattern dimension. More specifically, the resist dimension which depends on a pattern density (periodicity) remarkably varies upon changing the size and shape of the illumination area, and the luminance distribution in the illumination area. In order to form the same dimensional resist for the plurality of patterns having different pattern densities, the mask pattern dimension must be changed in accordance with the pattern densities (i.e., dimensional correction (proximity effect correction)). Alternatively, a proximity effect correction amount must be changed in accordance with the state of the illumination luminance distribution.

In order to calculate the proximity effect correction amount, a lithography simulator program is used. The lithography simulator program loads mask pattern information, exposure apparatus information including illumination luminance information, resist information, and process information, and calculates the resist pattern dimension on the substrate.

Conventionally, in order to input the illumination luminance information to the program, the method of representing the illumination luminance distribution by using a function preset in the program, or the method of causing the program to load arbitrary luminance distribution information is available. In the former method, for example, a distribution having a uniform luminance within a predetermined range (circle, ring, or the like), or a distribution wherein the density Gaussian-functionally attenuates from the central portion to the outer peripheral portion of the illumination area can be set. In the latter method, the distribution can be set by loading the luminance data obtained by sampling the measurement results of the exposure apparatus luminance distribution, and arranging the sampled measurement results as a matrix e.g., at substantially constant intervals in the horizontal and vertical directions.

Note that Jpn. Pat. Appln. KOKAI Publication No. 2000-232057 discloses a technique for obtaining a photosensitive solution density distribution and a pattern outline in the resist film by a numerical calculation, in further consideration of a substrate structure in the optical image simulation process of setting the wavelength of exposure light, an illumination condition, a lens condition, and defocus data as input values.

Jpn. Pat. Appln. KOKAI Publication No. 2003-37050 discloses a technique for calculating the scattering of electrons irradiating a point on a resist layer, deriving the spatial distribution function of an energy storage amount corresponding to the scattering state, calculating the spatial distribution function of the overall resist layer, calculating to convert the energy storage amount into a development rate, and simulating the resist shape pattern from the development calculation.

Jpn. Pat. Appln. KOKAI Publication No. 2001-60540 discloses a technique for calculating the storage energy irradiating a point on the resist layer, dividing the distribution using a radial storage energy distribution from the calculated incident point, and predicting the resist pattern shape from the storage energy for each unit volume and the storage energy of the overall resist layer.

(Problem of First Background Art)

In the simulation process of the mask data correction, a simulation parameter which represents a process condition is superposed on the calculation result of the light intensity distribution on a substrate surface based on mask information and the exposure apparatus information. Hence, the exposure apparatus information is very important. Note that when using the exposure apparatus, the NA, σ, ring shielding ratio can be selected. However, because of errors caused by assembling and designing the exposure apparatus, the actual exposure apparatus cannot have the characteristics (more specifically, the light intensity distribution) predicted by the specific NA, σ, ring shielding ratio. In order to perform the simulation corresponding to the actual condition, the simulation must be performed using the shift of an actual exposure apparatus characteristic from an ideal exposure apparatus characteristic.

Upon calculating the process parameter on the basis of the simulation performed without using the shift of the actual exposure apparatus characteristic from the ideal exposure apparatus characteristic, generally, the process parameter has low consistency with the experimentally-acquired parameter, and includes an error from the parameter obtained by using the shift from the ideal exposure apparatus characteristic. In accordance with this process parameter, when the mask data correction is performed by the simulation without using the shift from the ideal exposure apparatus characteristic, the correction precision decreases when the experimentally-generated pattern is not similar to the pattern to be corrected.

A lens aberration of the shifts of the actual exposure apparatus characteristics from the ideal exposure apparatus characteristics is frequently studied, and this aberration is used only in the mask data correction. Alternatively, in the latest KrF or ArF exposure apparatus, a Zernike aberration coefficient is suppressed to some $m\lambda$ ($\lambda$ is the wavelength), and the shift of the actual exposure apparatus characteristic from the ideal exposure apparatus characteristic is very small. Also, the shift of the light intensity distribution (called a flare) is used in the mask data correction.

Also, an exposure apparatus illumination nonuniformity (to be referred to as an illumination luminance deviation hereinafter) occurs, which is the shift of the actual exposure apparatus characteristic from the design exposure apparatus characteristic, and remarkably influences the intensity distribution of the light projected on the substrate through the mask.

Kazuya Sato, et al., Proc. SPIE vol. 3679, pp. 99-107 (1999) discloses the measurement method of the illumination luminance deviation in the exposure apparatus. This literature indicates that the illumination luminance deviation changes the OPE state, and this, in turn, affects the other general pattern shape.

(Second Problem of Background Art)

Recently, along with micropatterning of a semiconductor device, the error of the illumination luminance distribution of the exposure apparatus cannot be ignored. That is, the resist pattern dimensional prediction precision is not always sufficient only by using the function in the program. In this case, the illumination luminance distribution of the exposure apparatus must be measured to predict the resist pattern dimension by using the measurement result.

However, the information amount of the luminance data input as the matrix data is too big and overloads the program. For example, when using 300 (horizontal)×300 (vertical) data, 90,000 coordinates and luminance data are held to calculate in the program. Hence, this calculation takes a long time. The information amount can be reduced by thinning the luminance data.

However, luminance information required for precisely predicting the resist pattern shape may be lost.

BRIEF SUMMARY OF THE INVENTION

According to an aspect of the invention, there is provided a mask data correction method used when forming a photomask used in a photolithography process, comprising: correcting mask data on the basis of simulation performed by using information including nonuniformity of an illumination luminance distribution in an exposure apparatus which uses the photomask formed by using the mask data obtained by the correction result.

According to another aspect of the invention, there is provided a mask data correction method used when forming a photomask used in a photolithography process, when calculating a process parameter which represents an effect of a resist process, comprising: forming a resist pattern in the lithography process; measuring a shape of the resist pattern; performing simulation by using the information including a nonuniformity of an illumination luminance distribution in an exposure apparatus; and searching for the process parameter of the simulation which is closest to a measurement value in the measurement.

According to another aspect of the invention, there is provided a photomask manufacturing method of manufacturing a photomask from mask data corrected in the method.

According to another aspect of the invention, there is provided a computer program stored in a computer readable recording medium, the program which allows a computer to correct mask data on the basis of simulation performed by using information including nonuniformity of an illumination luminance distribution in an exposure apparatus which uses a photomask generated by using the mask data obtained from a correction result of the correction program.

According to another aspect of the invention, there is provided a computer program stored in a computer readable recording medium, the program which allows a computer to perform, when calculating a process parameter which represents an effect of a resist process, forming a resist pattern in a lithography process, measuring a shape of the resist pattern, performing simulation by using information including nonuniformity of an illumination luminance distribution in an exposure apparatus, and searching for the process parameter of the simulation in which a pattern dimensional value obtained by the simulation is closest to the measurement value in the measurement.

According to another aspect of the invention, there is provided an optical image prediction method of irradiating a photomask with light from a light source, and predicting an optical image formed near a substrate surface by projecting the light from the photomask, comprising: approximating, by using a predetermined function group, a light source luminance distribution input as matrix data, and holding information of the luminance distribution as the function group and a coefficient group thereof; and calculating the optical image formed on the substrate surface on the basis of the function group and the coefficient group, and pieces of information of mask data and a projection lens.

According to another aspect of the invention, there is provided a resist pattern shape prediction method comprising calculating a shape of a resist pattern formed on the substrate surface on the basis of information of an optical image calculated in the method, pieces of information of a photoresist, a lower film, and a surface protection film on the substrate surface, information of a substrate heating process, and information of a substrate development process.

According to another aspect of the invention, there is provided a mask data correction method comprising: calculating a difference between a resist pattern shape calculated in the calculation and a desired resist pattern shape; and when the difference is at least a predetermined value, correcting the mask data to reduce the difference.

According to another aspect of the invention, there is provided a computer program stored in a computer readable recording medium, the program which allows a computer to execute approximating a light source luminance distribution input as matrix data, by using a predetermined function group, and holding information of the luminance distribution as the function group and a coefficient group thereof, and calculating an optical image formed on a substrate surface on the basis of the function group and the coefficient group, and pieces of information of mask data and a projection lens.

According to another aspect of the invention, there is provided a computer program stored in a computer readable recording medium, the program which allows a computer to execute approximating a light source luminance distribution input as matrix data, by using a predetermined function group, and holding information of the luminance distribution as the function group and a coefficient group thereof, calculating an optical image formed on a substrate surface on the basis of the function group and the coefficient group, and pieces of information of mask data and a projection lens, and calculating a shape of a resist pattern formed on the substrate surface, on the basis of information of the calculated optical image, pieces of information of a photoresist, a lower film, and a surface protection film on the substrate surface, information of a substrate heating process, and information of a substrate development process.

According to another aspect of the invention, there is provided a semiconductor device manufacturing method of manufacturing a semiconductor device by using mask data corrected in the mask data correction method.

According to another aspect of the invention, there is provided a semiconductor device manufacturing method of manufacturing a semiconductor device by using a photomask manufactured from the method.

According to another aspect of the invention, there is provided a semiconductor device manufacturing method of manufacturing a photomask by using a mask data corrected in the mask data correction method and manufacturing a semiconductor device by using the photomask.

BRIEF DESCRIPTION OF THE SEVERAL VIEWS OF THE DRAWING

FIG. 9 is a view showing matrix data according to the third embodiment;

FIG. 10 is a table showing a Zernike polynominal according to the third embodiment;

FIG. 13 is a graph showing a resist dimensional prediction value corresponding to a pattern density according to the fourth embodiment.

DETAILED DESCRIPTION OF THE INVENTION

Embodiments will be described below with reference to accompanying drawings.

In the first embodiment, in order to improve the precision of mask data correction in a photolithography process in a semiconductor device manufacturing process, and the precision of a process parameter which represents the effect of a resist process in a simulation process for the mask data correction, the measurement result of an illumination luminance deviation in an exposure apparatus is used in the simulation process for the mask data correction.

Figure 1:
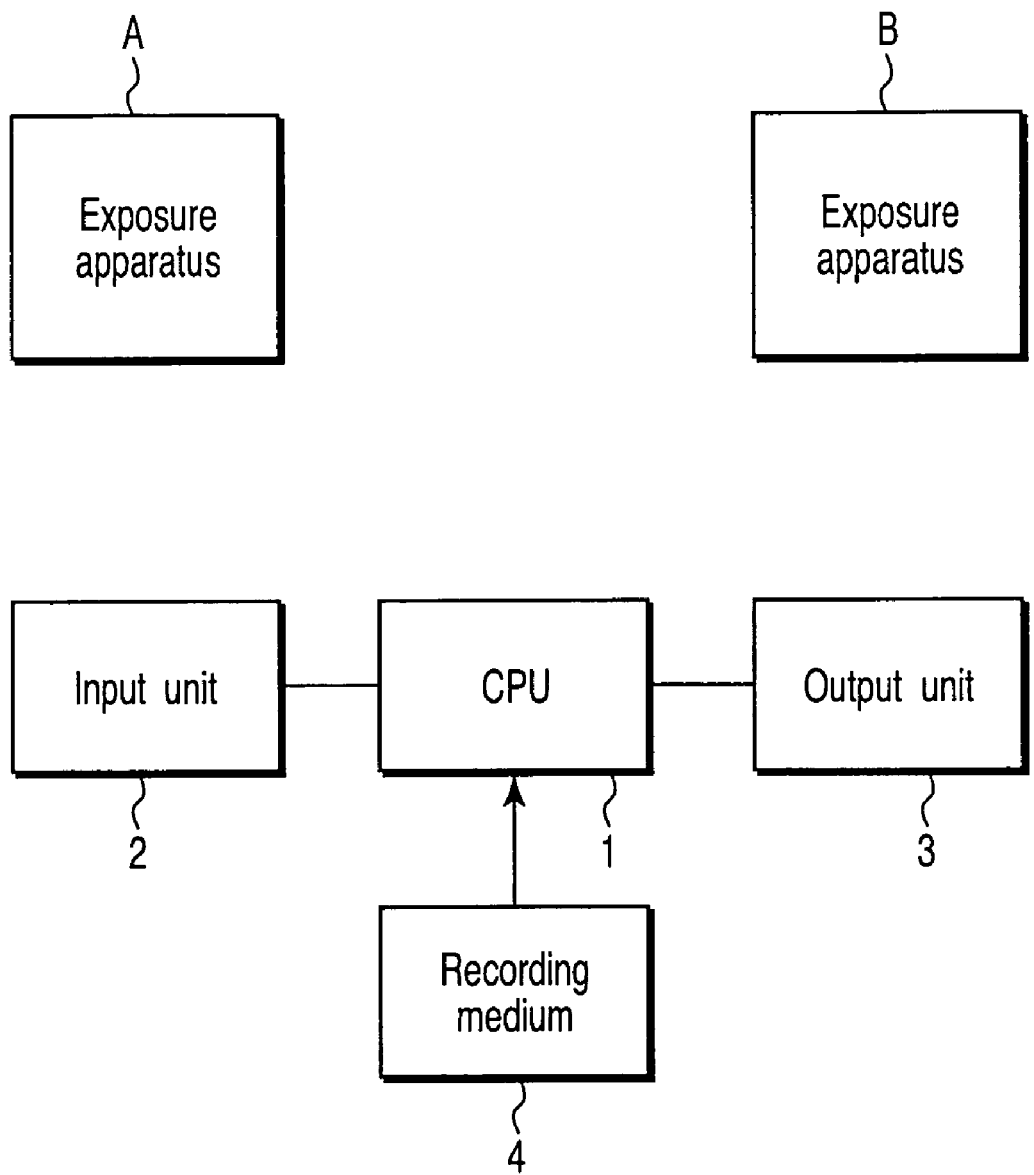
FIG. 1 is a block diagram showing the arrangement of a system which performs a mask data correction process according to the first embodiment.

FIG. 1 is a block diagram showing the system arrangement for performing the mask data correction process according to the first embodiment. In FIG. 1, reference symbols A and B denote exposure apparatuses. A CPU (computer) 1 connects an input unit 2 and an output unit 3. The CPU 1 includes a program for performing the mask data correction process (to be described later). Note that this program can be stored in a recording medium 4, and loaded by the CPU 1.

Figure 2:
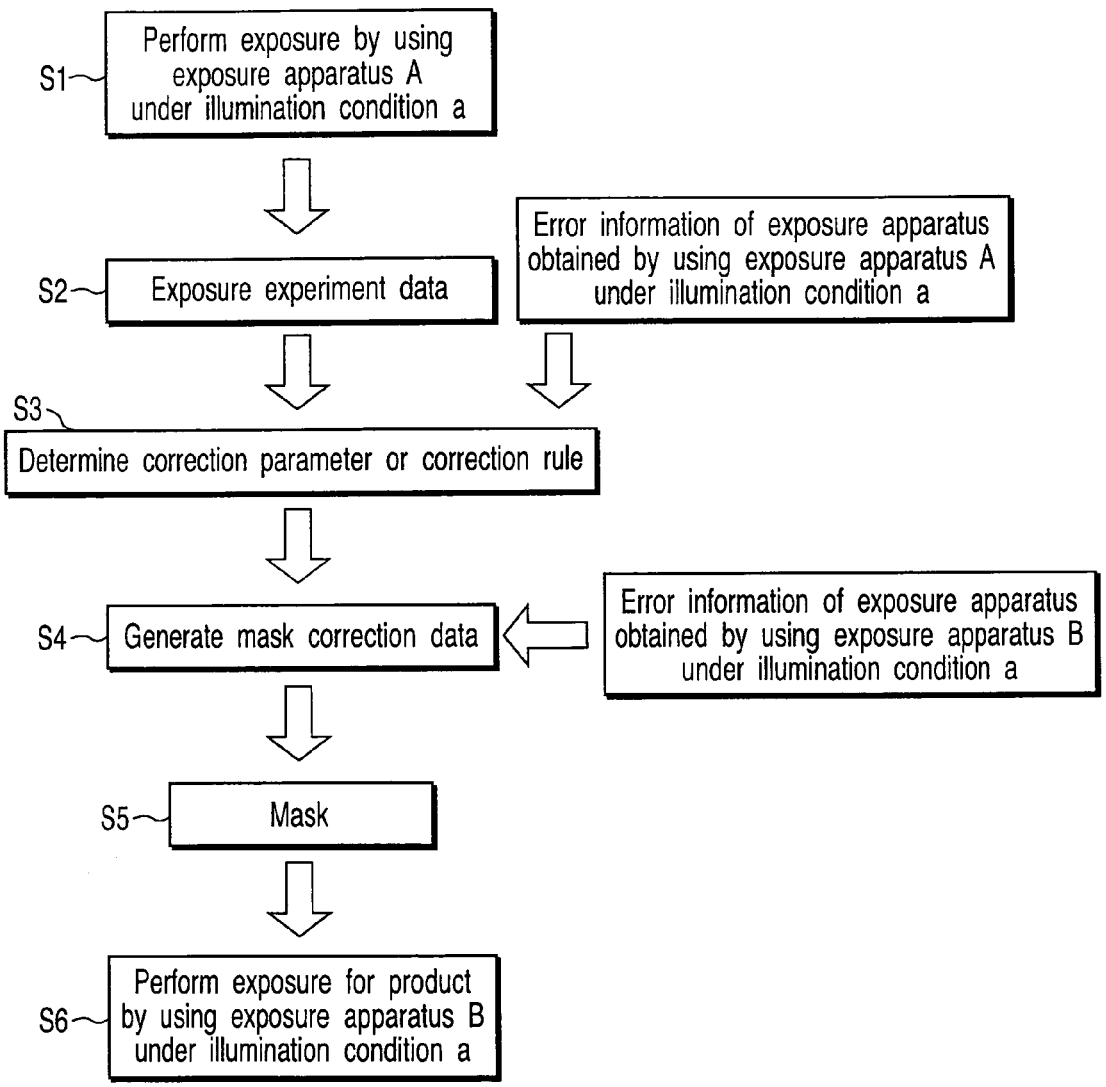
FIG. 2 is a flowchart showing the mask data correction procedure of a photomask according to the first mask.

FIG. 2 is a flowchart showing the mask data correction procedure of a photomask according to the first embodiment. In step S1, a user causes an exposure apparatus A to perform experimental exposure for an experimentally-generated pattern under an illumination condition a. In step S2, the user obtains exposure experimental data. In step S3, on the basis of the exposure experimental data input from the input unit 2, the CPU 1 performs the simulation by using the exposure apparatus error information input from the input unit 2 by using the exposure apparatus A under the illumination condition a. As a result, a process parameter or correction rule is determined. This exposure apparatus error information contains at least one of the shift of an NA outline value, the shift of a σ outline value, the deviation of a projection lens transmission ratio, the deviation of an illumination luminance, an aberration, a flare, and a scan synchronization error. Note that the nonuniformity of two-dimensional light source luminance distribution represents the nonuniform luminance in an area where the luminance is not about 0.

In step S4, on the basis of the process parameter or the correction rule, the CPU 1 performs the simulation by using the exposure apparatus error information input from the input unit 2 by using an exposure apparatus B under the illumination condition a, to generate the mask correction data. In step S5, on the basis of the mask correction data, the CPU 1 corrects the mask data, and outputs the corrected mask data from the output unit 3. In step S6, the user causes the exposure apparatus B to expose a product under the illumination condition a, by using the photomask generated by this mask data. The above-descried process also applies when the exposure apparatus A is the same as the exposure apparatus B. Consequently, semiconductor devices are manufactured by using the photomask generated as described above.

The above-described process is different from the conventional one in that the actual exposure apparatus error information is used when generating the mask correction data.

Figure 3:
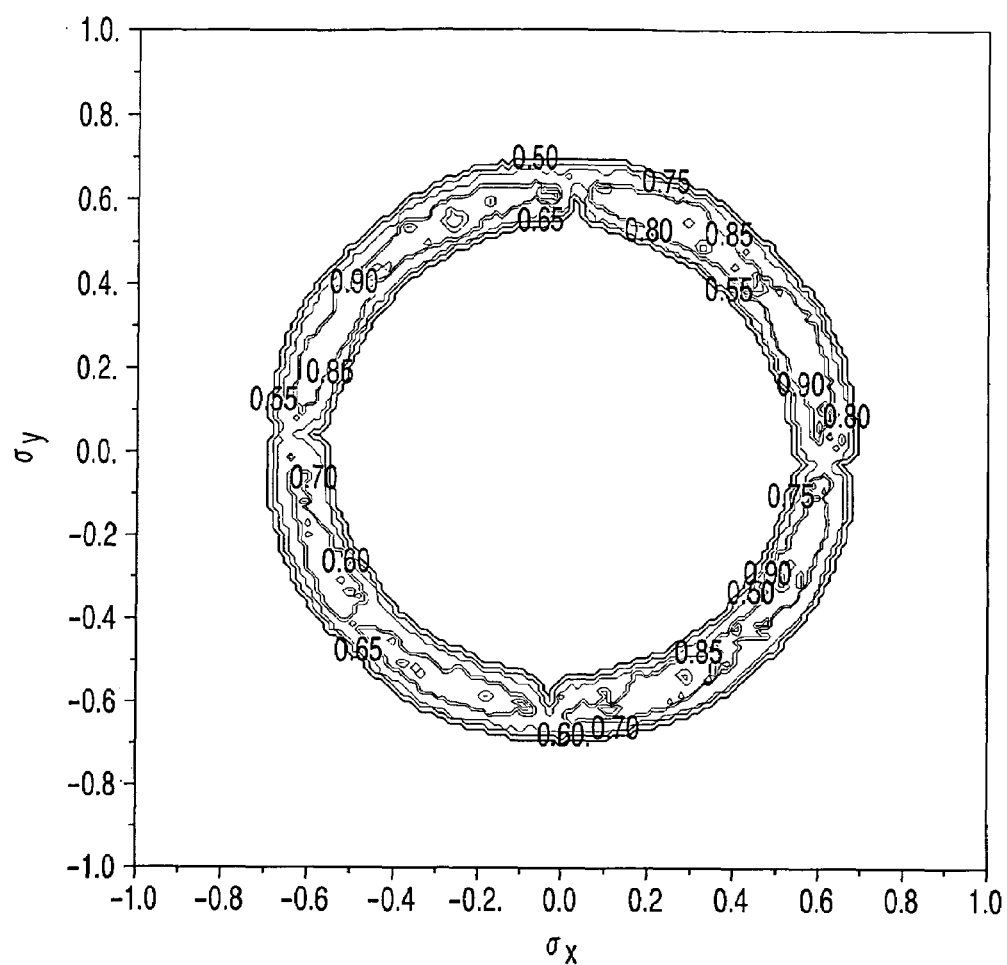
FIG. 3 is a view showing an illumination luminance deviation distribution in a projection exposure apparatus according to the first embodiment.

FIG. 3 shows the distribution of the illumination luminance deviation in the projection exposure apparatus according to the first embodiment. FIG. 3 shows the illumination luminance deviation distribution in one exposure area in the exposure apparatus B having a set illumination conditions where NA=0.63, σ=0.75, and ring shielding ratio is 2/3. In the ideal exposure apparatus, the illumination luminance in the ring where σ=0.75, and ring shielding ratio is 2/3 is uniform. Alternatively, in the distribution of the actual measurement values of the exposure apparatus B shown in FIG. 3, the illumination luminance tends to be higher toward the center of the ring in the radial direction. Note that this illumination luminance deviation distribution can also be obtained from the process value of the measurement value.

Even in the same exposure apparatus, the illumination luminance distribution varies in accordance with the position in the exposure area. Therefore, by using the illumination luminance deviation distribution at the position in the exposure area corresponding to the pattern to be corrected, the mask data can be corrected at higher precision.

However, when measuring the illumination luminance deviation, in accordance with the layout of the mask used for measuring the deviation, the measurable position in the exposure area is limited. Also, because of differences in the measurement efficiency and measurement time, the measurement value of the illumination luminance deviation does not always correspond to the pattern to be corrected. In such a case, the nearest measurement value may be used instead, or a plurality of near measurement values, i.e., interpolation may be used for the calculation.

Figure 4:
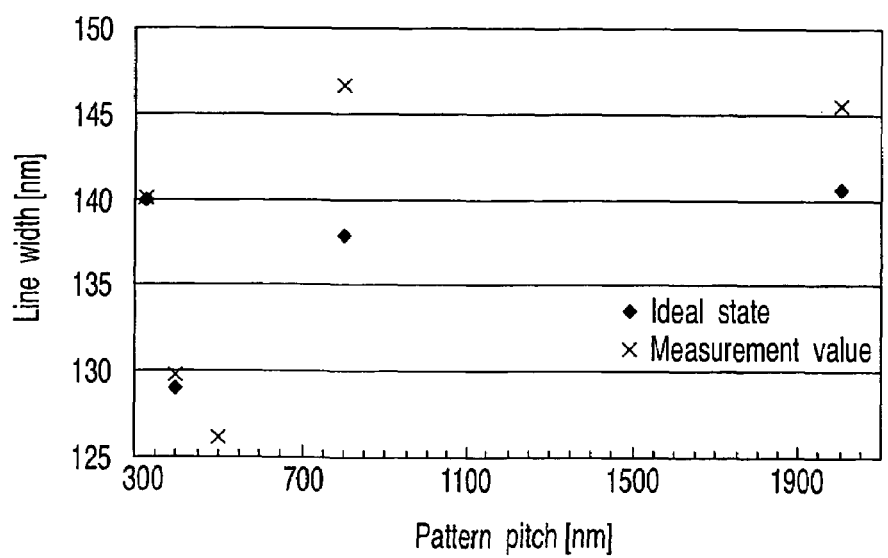
FIG. 4 is a graph showing an example of dimensional change in accordance with whether the illumination luminance deviation is used in a spatial image calculation according to the first embodiment.

FIG. 4 shows an example of the dimensional variation in accordance with whether the illumination lamination deviation is used in spatial image calculation. In FIG. 4, the same pattern is used on an attenuated phase-shift mask having a transmission ratio of 6.3% and a phase difference of 181°.

Also, FIG. 4 shows the results obtained when the ideal exposure apparatus value (the wavelength is 193 nm, and the exposure apparatus illumination condition is completely the same as the set value given when NA=0.63, σ=0.75, and the ring shielding ratio is 2/3) is used, and when the actual exposure apparatus measurement value (NA is the same, but the illumination luminance deviation is present) is used.

In FIG. 4, a pattern dimension (line width) is calculated by using, as a threshold value, the light intensity in the illumination condition where the pattern pitch is 325 nm, and the pattern dimension is 140 nm. As shown in FIG. 4, when the pattern pitch is 800 or 2,000 nm, the pattern dimension of the ideal exposure apparatus is smaller by about 10 or 5 nm than the actual exposure apparatus measurement value.

That is, assume that a true correction value is represented when using the actual exposure apparatus measurement value. When the mask correction is performed by using an ideal exposure apparatus value in error, a correction error occurs as described above. Alternatively, by using the actual exposure apparatus measurement value having an illumination luminance deviation, the correction precision may be improved by a maximum of about 10 nm.

Figure 5:
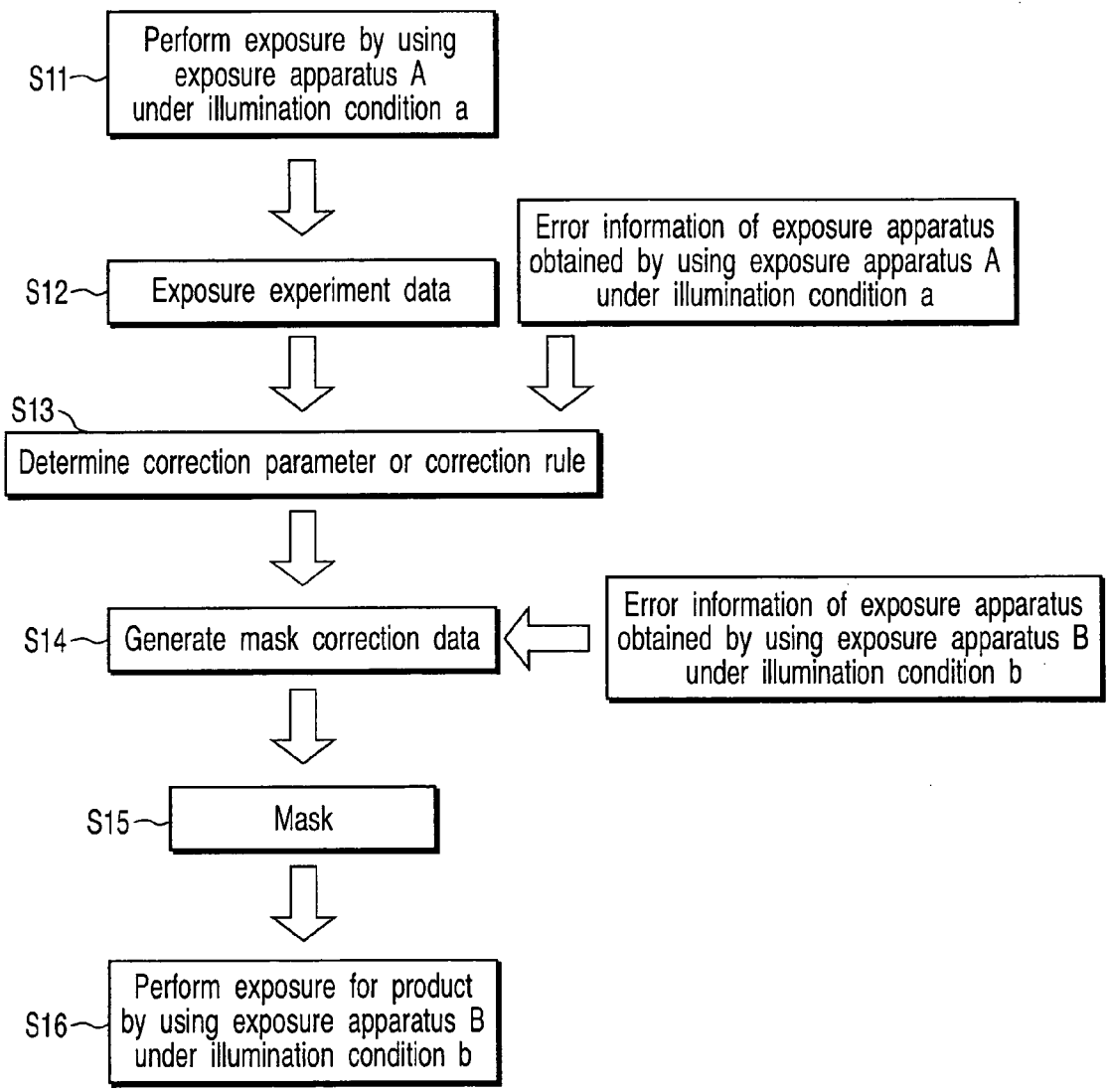
FIG. 5 is a flowchart showing the first modification of the mask data correction procedure of the photomask according to the first embodiment.

FIG. 5 is a flowchart showing the first modification of the mask data correction procedure of a photomask according to the first embodiment. In step S11, a user causes an exposure apparatus A to perform experimental exposure for an experimentally-generated pattern under an illumination condition a. In step S12, the user obtains exposure experimental data. In step S13, on the basis of the exposure experimental data input from the input unit 2, the CPU 1 performs the simulation by using the exposure apparatus error information input from the input unit 2 by using the exposure apparatus A under the illumination condition a. As a result, a process parameter or correction rule is determined.

In step S14, on the basis of the process parameter or the correction rule, the CPU 1 performs the simulation by using the exposure apparatus error information input from the input unit 2 by using an exposure apparatus B under an illumination condition b, to generate the mask correction data. In step S15, on the basis of the mask correction data, the CPU 1 corrects the mask data, and outputs the corrected mask data from the output unit 3. In step S16, the user causes the exposure apparatus B to expose a product in the illumination condition b, by using the photomask generated by this mask data. The above-descried process also applies when the exposure apparatus A is the same as the exposure apparatus B, when the exposure apparatuses A and B are the same and the illumination conditions a and b are also the same, and when the exposure apparatuses A and B are not the same but the illumination conditions a and b are the same. Consequently, semiconductor devices are manufactured by using the photomask generated as described above.

Figure 6:
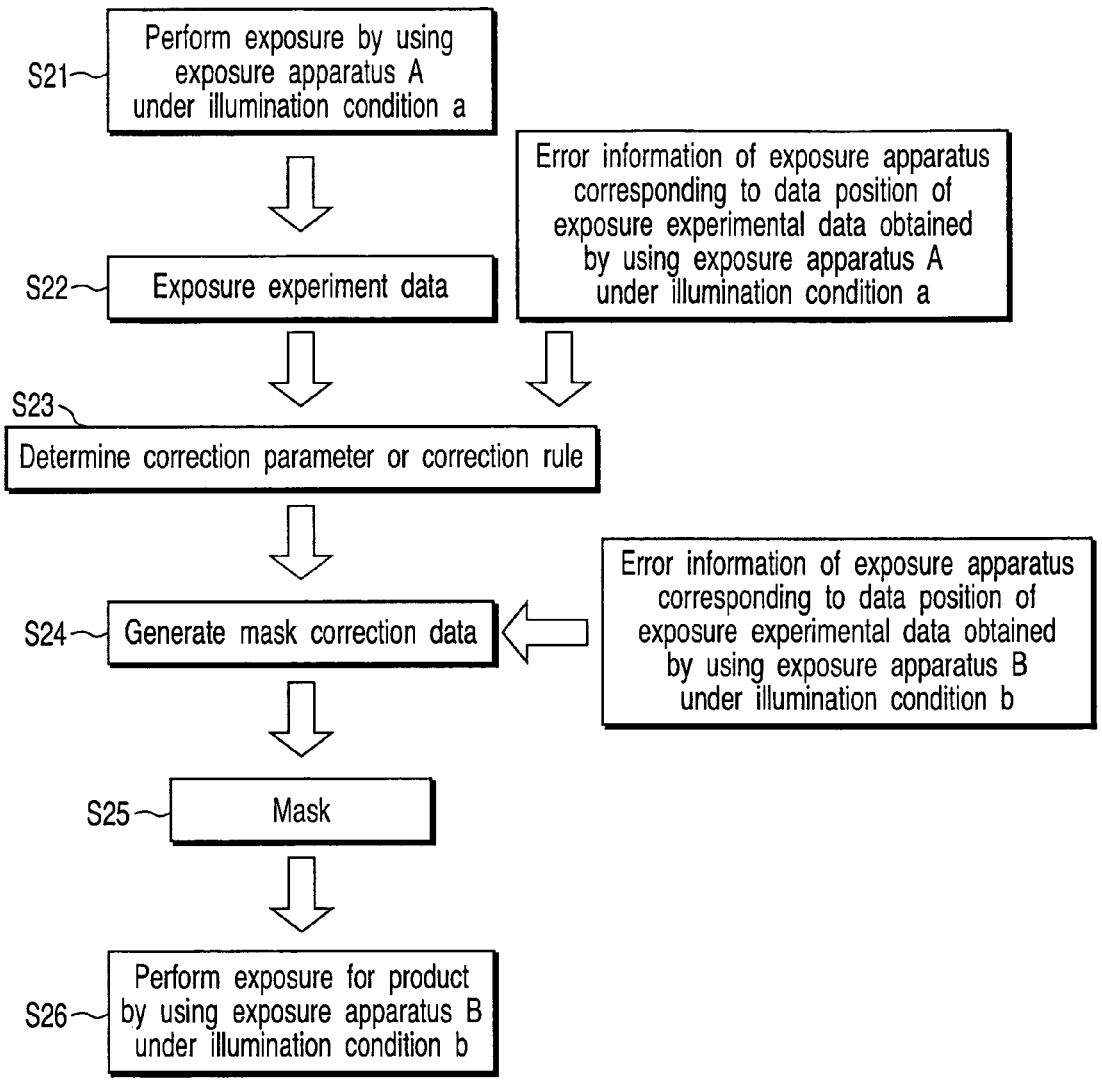
FIG. 6 is a flowchart showing the second modification of the mask data correction procedure of the photomask according to the first embodiment.

FIG. 6 is a flowchart showing the second modification of the mask data correction procedure of a photomask according to the first embodiment. In step S21, a user causes an exposure apparatus A to perform experimental exposure for an experimentally-generated pattern under an illumination condition a. In step S22, the user obtains exposure experimental data. In step S23, on the basis of the exposure experimental data input from the input unit 2, the CPU 1 performs the simulation by using the exposure apparatus error information corresponding to the data position of the exposure experiment data, which is input from the input unit 2 by using the exposure apparatus A under the illumination condition a. As a result, a process parameter or correction rule is determined.

In step S24, on the basis of the process parameter or the correction rule, the CPU 1 performs the simulation by using the exposure apparatus error information corresponding to the data position of the exposure experiment data, which is input from the input unit 2 by using an exposure apparatus B under the illumination condition b, to generate the mask correction data. In step S25, on the basis of the mask correction data, the CPU 1 corrects the mask data, and outputs the corrected mask data from the output unit 3. In step S26, the user causes the exposure apparatus B to expose a product under the illumination condition b, by using the photomask generated by this mask data. The above-descried process also applies when the exposure apparatus A is the same as the exposure apparatus B, when the exposure apparatuses A and B are the same and the illumination conditions a and b are also the same, and when the exposure apparatuses A and B are not the same but the illumination conditions a and b are the same. Consequently, semiconductor devices are manufactured by using the photomask generated as described above.

In the second embodiment, first, an organic anti-reflection film is formed on an Si substrate, and a commercially available ArF exposure apparatus chemical amplification resist film is formed on this organic anti-reflection film. Focus-exposure matrix exposure (to be referred to as an FEM exposure) is experimentally performed on this substrate via an attenuated phase-shift mask having a transmission ratio of 6.3% and a phase difference of 181°, by using an ArF exposure apparatus having an illumination conditions where NA=0.63, σ=0.75, and ring shielding ratio is 2/3. After that, a resist pattern is obtained by heating and developing the substrate. As described above, the resist pattern is formed in the lithography process.

Next, the resist pattern dimension (shape) is measured by using a scanning electron microscope (to be referred to as a CD-SEM hereinafter). Note that the exposure apparatus in the first embodiment is operated in a scan-and-repeat scheme, but that in the second embodiment performs exposure in a step-and-repeat scheme.

Then, parameter fitting is executed for the exposure amount and a Focus dependence corresponding to the resist pattern dimension obtained by the FEM exposure, to calculate an optimal simulation parameter for reproducing an experimental result. That is, a simulation process parameter which is closest to the measurement value of the resist pattern dimension is searched. In this case, PROLITH ver. 7.2.2 available from KLA-Tencor is used as a simulator, and Auto-Tune available from KLA-Tencor is used as a parameter fitting tool. As the patterns to be fitted, five types of patterns having mask sizes calibrated on the wafer, e.g., pattern pitches of 325, 400, 500, 800, and 2,000 nm and a line width of about 130 nm are used. The mask dimension uses the value which is separately measured.

Figures 7, 8:
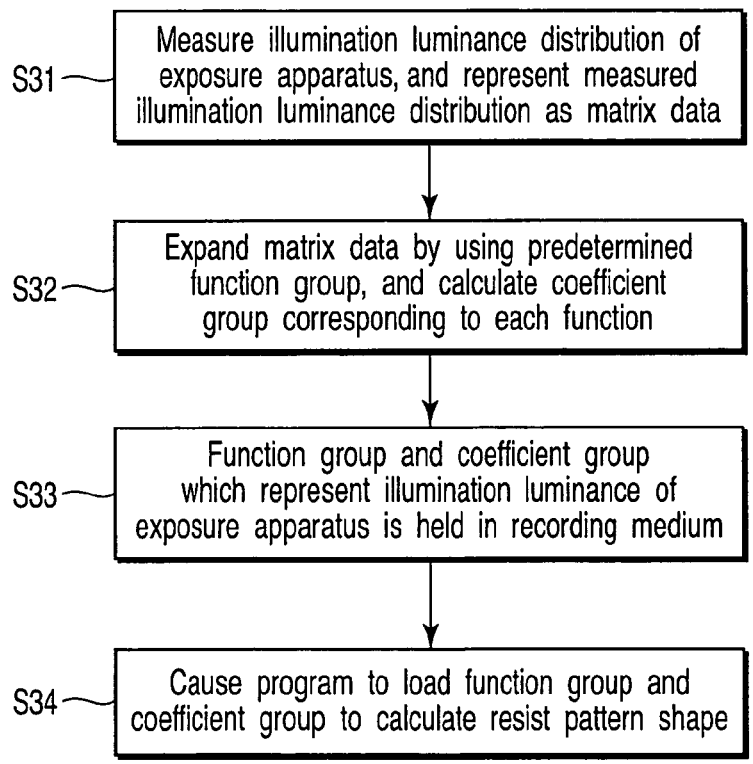
FIG. 7 is a table showing a fitting residual of an optimal parameter group in accordance with whether the illumination luminance deviation is used according to the second embodiment.
FIG. 8 is a flowchart showing the operation procedure of a program according to the third embodiment.

In this simulation process, without consideration of the illumination luminance deviation, but in consideration of the aberration, the parameter is optimized in the design exposure apparatus in the condition where NA=0.63, σ=0.75, and ring shielding ratio is 2/3. FIG. 7 shows an example of the parameter fitting results. In this condition, even when the fitting residual is minimum, i.e., an optimal parameter group is used (more specifically, when the pattern pitch is 800 nm), a residual average of about 7.58 nm is generated.

Alternatively, when the measurement value of the illumination luminance deviation is used as the database without changing the NA in the above-described simulator, the parameter fitting is also performed. The aberration is also considered. In this case, in an optimal parameter group, as shown in FIG. 7, the fitting residual is remarkably improved in comparison with that obtained by setting the design exposure apparatus as the above-described illumination condition.

That is, by performing the simulation using the illumination luminance deviation, a higher-precision process parameter can be calculated.

Next, the mask data is corrected by using the above-described process parameter using the above-described illumination luminance deviation. In this case, the measurement value of the illumination luminance deviation at the position corresponding to the mask data is used. When the exposure apparatus which is used for experimental exposure to obtain a process parameter is different from that which may use the mask generated by the corrected mask data, or when the exposure apparatuses are the same but the illumination conditions are different, the measurement value of the illumination luminance deviation of each of the exposure apparatuses using the corrected mask is used.

The measurement value of the illumination luminance deviation is not directly used, but is used after decreasing a data density to ¼. This is because a calculation time is excessively large when directly using the measurement value. Since the data density is decreased to ¼, the calculation time is decreased to about ⅕ as compared with that obtained when the measurement value is directly used.

Alternatively, when the data density is too small, the illumination luminance deviation distribution cannot be represented. In order to represent a quartic distribution of the illumination luminance deviation, at least 9 data in each of X- and Y-directions are preferably used along at least the X- and Y-directions in a continuous area having a luminance which is mostly not 0. More preferably, at least 13 data are used, because a sextic distribution can be represented. As described above, in consideration of the calculation time and the precision, the measurement value of the illumination luminance deviation may be processed as needed.

A case of the measurement values in the exposure area different from that in the above-described example will be described below. When data which representing obviously abnormal value is used, as compared with the illumination luminance around the position where the measurement value is obtained, or the measurement result at a different position in the exposure area, the measurement value is corrected by using the illumination luminance of a peripheral portion by the interpolation process.

As described above, when the illumination luminance deviation of the exposure apparatus is present, a large difference may occur in the correction result. FIG. 7 shows the cases where the same pattern is used on a phase-shift mask having a transmission ratio of 6.3% and a phase difference of 181°, where the ideal exposure apparatus value (the wavelength is 193 nm, and the exposure apparatus illumination condition is completely the same as the set value given when NA=0.63, σ=0.75, and the ring shielding ratio is 2/3) is used, and where the actual exposure apparatus measurement value (NA is same, but the illumination luminance deviation is present) is used. As shown in FIG. 4, when the pattern pitch is 800 or 2,000 nm, the pattern dimension of the ideal exposure apparatus is smaller by about 10 or 5 nm than the actual exposure apparatus measurement value.

As a result, when the mask generated by using the mask data corrected in the ideal illumination condition and the exposure apparatus having the illumination luminance deviation are used, at a pattern pitch of 800 or 2,000 nm, the pattern is excessively corrected by about 10 or 5 nm to thicken the pattern. As a result, the expected characteristics of the semiconductor device cannot be obtained. However, in the second embodiment, by using the actual exposure apparatus measurement value having the illumination luminance deviation, the correction precision is expected to improve by a maximum of about 10 nm, and the expected characteristic of the semiconductor device can be obtained.

In the measurement result of the illumination luminance deviation, when the data density is too high, the data access time overloads the program. Therefore, a maximum effect of the calculation time and precision can be obtained by compressing or thinning the measurement data in an optimal method, such that the data density corresponds to the calculation precision.

The illumination luminance deviation is not completely uniform but has a difference in the exposable range of the exposure apparatus. Therefore, the precision can be improved by using the measurement value at a position corresponding to the mask data.

As described above, when the illumination luminance deviation of the exposure apparatus is present, the calculated simulation parameter may have a difference. FIG. 7 shows the reproducibility of an experimental value obtained by parameter fitting in the simulation, when the same pattern is used on an attenuated phase-shift mask having a transmission ratio of 6.3% and a phase difference of 181°, when the ideal exposure apparatus value (the wavelength is 193 nm, and the exposure apparatus illumination condition is completely the same as the set value given when NA=0.63, σ=0.75, and the ring shielding ratio is 2/3) is used, and when the actual exposure apparatus measurement value (NA is the same, but the illumination luminance deviation is present) is used. When the ideal illumination state is set at a pattern pitch of 800 nm, a fitting error of about 7.58 nm is still present. Alternatively, when the measurement value using the illumination luminance deviation is used, the fitting residual decreases to ½. Therefore, in consideration of the illumination luminance deviation, even when the mask pattern is corrected, the precision becomes higher than that of the ideal state by at least 3 nm.

In place of using the illumination luminance deviation in the second embodiment, a mask data correction method in which the illumination luminance is uniform, and the optimal values of the NA, σ, ring shielding ratio, and the like are calculated as the process parameter is also available. In this case, the correction error can also be suppressed within the range which can be interpolated by using the process parameter and a pattern similar to the pattern used for optimizing the illumination condition. However, with this method, the correction precision may decrease in a complicated pattern.

In the second embodiment, in addition to the effect for obtaining the high-precision process parameter, when the exposure apparatus which obtains the process parameter is different from that which uses the corrected mask data, or when the NAs and the attenuated illumination shapes are different from each other even if these exposure apparatuses are the same, a high-precision correction result can be obtained.

Also, the illumination luminance deviation is not completely uniform in the exposable range of the exposure apparatus, but has a deviation. Therefore, the measurement value of the illumination luminance deviation at a position corresponding to the pattern to be corrected is used. Hence, a high-precision correction result can be obtained in the pattern generated by using the mask generated from the corrected mask data.

Furthermore, by using this method, even when the exposure apparatus which acquires the process parameter is different from that which uses the actually corrected mask data, more specifically, even when the illumination luminance distribution shapes of these exposure apparatuses are largely different, a high-precision correction result can be obtained.

In the third embodiment, light from the illumination light source of an exposure apparatus irradiates a photomask. An optical image to be formed on the peripheral portion of the substrate surface is predicted by projecting the light from this photomask on a substrate. In the third embodiment, in a program which predicts a resist pattern, the illumination luminance distribution data of the exposure apparatus is loaded to be expanded by using a predetermined function group (e.g., Zernike polynominal system). The illumination luminance information is held in a recording medium in the form of a function group and a coefficient group. When calculating the resist pattern, the luminance at the illumination light source position is reconstructed by using the function group and coefficient group held in the recording medium.

The operation procedure of the program used for predicting the resist pattern, and the operation performed by the user are described below. Note that the system arrangement executing the program in the third embodiment is the same as that in FIG. 1. A CPU 1 incorporates the program. Note that this program is stored in a recording medium 4, and loaded by the CPU 1.

FIG. 8 is a flowchart showing the operation procedure of the program according to the third embodiment. In step S31, the CPU 1 measures the illumination luminance distribution of the exposure apparatus, and represents the measured illumination luminance distribution as matrix data. In step S32, the CPU 1 expands the matrix data by using the predetermined function group, and obtains a coefficient group corresponding to the function. In step S33, the CPU 1 holds the function group and coefficient group, which represent the illumination luminance of the exposure apparatus, in the recording medium 4. In step S34, the CPU 1 loads the function group and coefficient group to calculate a resist pattern shape.

The above-described operation will be described in detail below. The user measures the illumination luminance distribution of the light source in the exposure apparatus, and represents the measured illumination luminance distribution as matrix data. For example, the matrix data is text digital data. For example, as shown in FIG. 9, the first column has an x-coordinate, the second column has a y-coordinate, and the third column has luminance information to form one row. Each row has the luminance information of one sampling point. The rows each having this arrangement continue by the number of sampling points to form the matrix data. The matrix data is held in the recording medium 4 such as a hard disk.

Next, on the basis of the program, the CPU 1 loads the matrix data which represents the illumination luminance distribution of the exposure apparatus from the recording medium 4, in accordance with the user's operation. The CPU 1 expands (approximates) the matrix data, having discrete data on a plane which represents the illumination, into a continuous function. For example, the continuous function includes a linear combination and expansion into a power series of an orthogonal function. As an example of the orthogonal function, a Zernike polynominal $Z_n(r, \theta)$ shown in FIG. 10 is used. In this case, an illumination luminance distribution $I(r, \theta)$ at the coordinates (r, 0) is expressed by $$I(r, \theta) = \Sigma a_n \cdot Z_n(r, \theta) \quad n=1 \ldots N, \text{ N is a positive integer.}$$

Note that (r, θ) expresses a plane by using polar coordinates, and has a relationship of x=r·cos θ, y=r·sin θ with the orthogonal coordinate system. For example, the origin of the coordinate system is the position from which the light which perpendicularly illuminates a reticle is emitted. When expanding into a power series, the illumination luminance distribution I(x, y) at the coordinates (x, y) is expressed by $$I(x, y) = \Sigma a_{lm} x^l \cdot y^m \quad l=1 \ldots L, m=1 \ldots M, L \text{ and } M \text{ are positive integers.}$$

The program holds the above-described plurality of function groups, and the user designates the type of the function group to be used from an input unit 2, in accordance with the loading instruction of the matrix data. The CPU 1 expands the input matrix data and calculates the coefficient group, by using the function designated by the user.

For example, when using the Zernike polynominal, a subroutine for calculating the Zernike polynominal ($Z_n$) value with respect to the designated coordinates information (r, θ) and the Zernike number (n) is included in the program. Also, the information (function group to be used) representing that the Zernike polynomial is used, and the coefficient group ($a_n$, n=(1 . . . N) is held in the recording medium 4.

When using the method of expanding into a power series, a subroutine for calculating the term value ($x^l y^m$) with respect to the designated coordinates information (r, θ) and the power series number (l, m) is included in the program. Also, the information (function group to be used) representing that the expanding into a power series is used, and the coefficient group ($a_{lm}$, l=1 . . . L, m=1 . . . M) is held in the recording medium 4.

Note that after expanding the matrix data of the illumination luminance distribution into a continuous function, the matrix data is not needed. Hence, the matrix data may be deleted from the recording medium 4.

The CPU 1 loads the information except for the illumination in accordance with the user's operation using the input unit 2. The information includes, more specifically, mask pattern data, projection lens information (the NA, aberration, flare, and the like). In order to load this information, the program may load the digital data generated by the user, or the user may make a choice among alternatives proposed by the program. After loading the information, in accordance with the information of the illumination luminance distribution including the function group and coefficient group in the recording medium 4, and the pieces of information of the mask pattern data and the projection lens input from the input unit 2, the CPU 1 calculates the optical image distribution formed on the substrate surface by the exposure apparatus, on the basis of the predetermined model. The optical image is the third-dimensional distribution of the electric field generated by the light. For example, the predetermined model includes a scalar model for calculating on the basis of the Fourier optics in consideration of the only the magnitude of the electric vector of light, and a vector model obtained in consideration of the magnitude and the vibration direction of the electric vector.

Figure 11A:
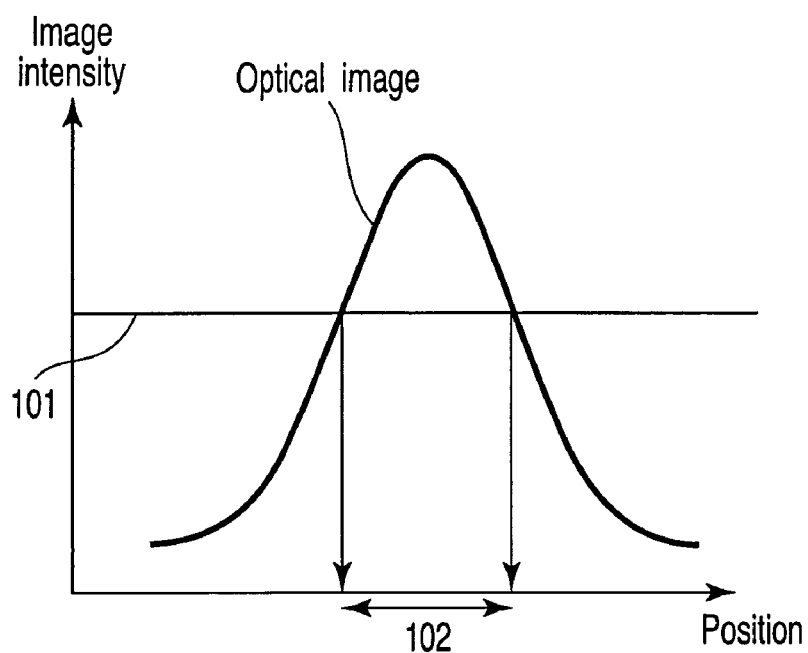
FIGS. 11A and 11B are graphs showing an optical image intensity corresponding to a pattern position according to the third embodiment.
Figure 11B:
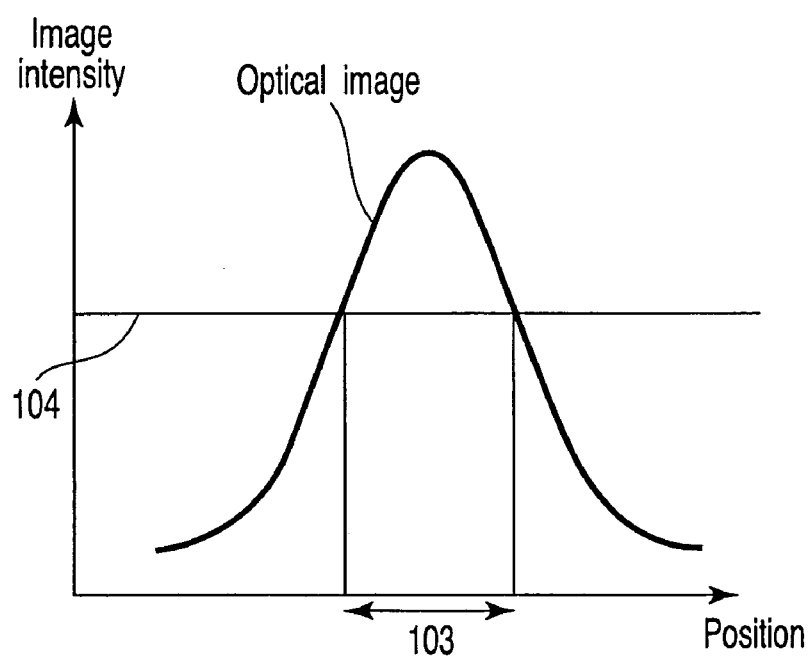

The optical image has a relative light intensity based on the light intensity obtained when the overall mask pattern is a transmittable area, and is equal to or more than 0. As shown in FIG. 11A, in accordance with the user's instruction from the input unit 2, the CPU 1 calculates a pattern dimension and a pattern position 102 in the optical image from a threshold value 101 of the defined optical image intensity. Alternatively, as shown in FIG. 11B, the CPU 1 calculates a threshold value 104 of the optical image intensity from a defined pattern position 103 and the pattern dimension. The optical image depends on the exposure apparatus information (illumination light source information and projection lens information), but does not depend on the resist on the substrate and the process. Hence, this calculation can be used to roughly assess the exposure apparatus state or the relationship between the set condition and the optical image. When the speed is more important than the precision, the pattern dimension obtained by calculating the optical image in FIG. 11A may serve as the resist dimension to perform the calculation. In the third embodiment, the calculation time can be reduced without degrading the precision of the optical image calculation.

In accordance with the user's operation of the input unit 2, the CPU 1 loads the pieces of information of a photoresist, a lower film, and a surface protection film on the substrate surface, and process information. The photoresist information includes a refractive index, an extinction coefficient, a diffusion length of an acid, sensitivity, and the like. The lower film information includes the refractive index, an extinction coefficient, and the like. The process information includes a temperature, a time, the density of a developing solution, a developing time, and the like in a post exposure bake (PEB) process. The process information also includes the pieces of information which relate to the substrate heating process and the substrate development process.

The CPU 1 may load the pieces of information of the resist, lower film, and process before calculating the optical image. The CPU 1 calculates the photosensitivity and dissolution of the resist from the information of the optical image formed on the substrate surface by the exposure apparatus which perform the calculation in advance, the input pieces of information of the photoresist, lower film, and surface protection film on the substrate surface, the information which relates to the substrate heating process, and the information which relates to the substrate development process. Finally, the CPU 1 calculates the resist pattern shape on the substrate surface. In accordance with a predetermined dimensional determination rule, the CPU 1 calculates the dimension (shape) of the resist pattern at the predetermined position on the substrate surface, and the calculated dimension (shape) is output from the output unit 3. The dimensional determination rule and the dimensional calculation point to be used are designated by the user from the input unit 2.

This method can be applied to the exposure apparatus which uses the exposure light having wavelengths of 365 nm (i beam), 248 nm (KrF), 193 nm (ArF), 157 nm (F2), or 10 to 15 nm (EUV).

Then, the operation procedure of the program used for the resist pattern prediction, and the user's operation are described below. Note that the system arrangement for executing the program in the fourth embodiment is same as that in FIG. 1. A CPU 1 includes the program. Note that this program is stored in a recording medium 4, and loaded by the CPU 1.

Figure 12:
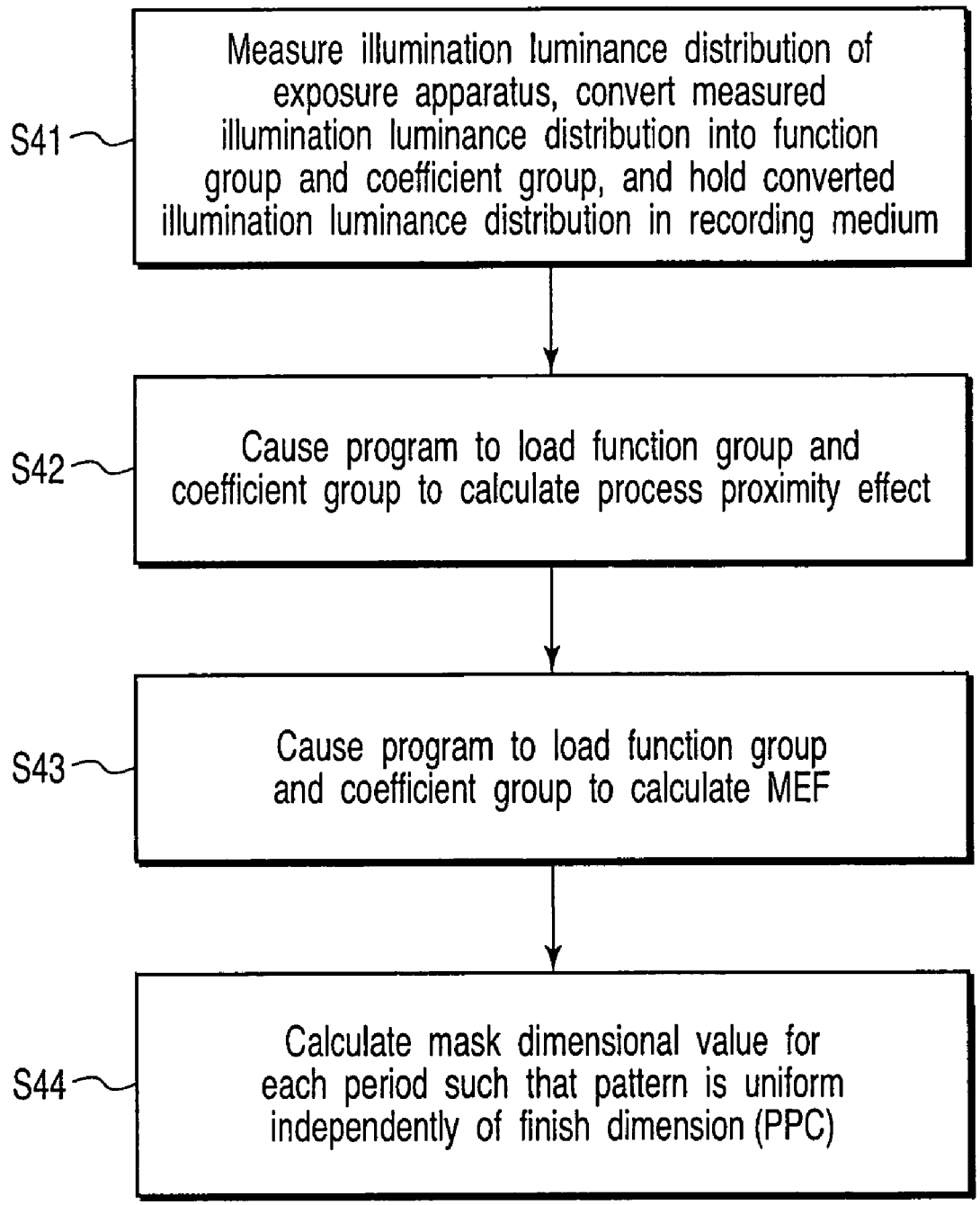
FIG. 12 is a flowchart showing the operation procedure of a program according to the fourth embodiment.

FIG. 12 is a flowchart showing the operation procedure executed by the program in the fourth embodiment. In step S41, the CPU 1 measures the illumination luminance distribution of an exposure apparatus. The measured illumination luminance distribution is converted into the function group and coefficient group, and the converted illumination luminance distribution is held in the recording medium 4. In step S42, the CPU 1 loads the function group and coefficient group from the recording medium 4 to calculate a process proximity effect (PPE). In step S43, the CPU 1 loads the function group and coefficient group from the recording medium 4 to calculate a mask error factor (MEF). The mask error factor is a ratio between a mask pattern dimensional error amount and a resist pattern dimensional variation amount caused by the mask pattern dimensional error on the substrate. In step S44, the CPU 1 calculates the mask dimensional value for each period (process proximity effect correction (PPC)) such that the pattern becomes uniform independently of a finish dimension.

In the fourth embodiment, the process in the third embodiment is applied to a plurality of mask patterns which have the same shape but different densities (periodicities) from the near patterns (adjacent patterns) as shown in FIG. 13A. Hence, the variation amount of the resist pattern dimension (shape) depending on the pattern density is calculated to predict the process proximity effect. Also, by using the same program, the variation amount of the resist pattern dimension (shape) given when the mask pattern dimension is slightly changed can be calculated. Hence, the difference between the calculated resist pattern dimension (shape) and the desired one can be calculated.

Furthermore, by using these pieces of information the variation amount of the resist dimension which depends on the pattern density can be corrected. Then, as shown in FIG. 13B, the correction amount of the mask pattern dimension can be calculated, which is required for forming a resist pattern having a uniform dimension independently of the pattern density. More specifically, when the above-described difference is equal to or more than the predetermined value, the mask pattern data is so corrected as to reduce the difference. Note that when the above difference does not become less than the predetermined value by one correction, the following processes are repeated until the difference becomes less than the predetermined value: the processes of calculating the optical image distribution, and calculating the resist pattern dimension (shape) in the third embodiment, and the processes of calculating the difference between the actual resist pattern dimension (shape) and the desired resist pattern dimension (shape), and correcting the mask pattern data in the fourth embodiment.

According to the embodiments of the present invention, the mask data correction method, the photomask manufacturing method, and the recording medium can be provided by using the actual exposure apparatus characteristics.

Also, according to the embodiments of the present invention, the optical image prediction method of accurately predicting the optical image in a short time by using the exposure apparatus, the resist pattern shape prediction method, and the semiconductor device manufacturing method can be provided. Hence, the proximity effect correction can be performed at high speed and precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A mask data correction method used when forming a photomask used in a photolithography process, comprising:
   obtaining a process parameter which represents an effect of a resist process on the basis of a first simulation performed by a processor using information including a non-uniformity in an illumination luminance distribution in a first exposure apparatus; and
   correcting mask data on the basis of a second simulation performed by processor using the process parameter and information including a non-uniformity in an illumination luminance distribution in a second exposure apparatus.

2. The method according to claim 1, wherein the information including the non-uniformity in the illumination luminance distribution shows that a luminance is not uniform in an area where the luminance is not zero.

3. The method according to claim 1, wherein the information including the non-uniformity in the illumination luminance distribution is a measurement value or a process value of the measurement value, and represents the illumination luminance distribution for illuminating a position to be corrected.

4. The method according to claim 1, wherein obtaining the process parameter comprises:
   forming a resist pattern in a lithography process;
   measuring a shape of the resist pattern;
   performing the first simulation by using the information including the non-uniformity in the illumination luminance distribution in the first exposure apparatus; and
   calculating the process parameter of the first simulation in which a pattern dimension by the first simulation is closest to a measurement value in the measurement.

5. The method according to claim 4, wherein the information including the non-uniformity in the illumination luminance distribution shows that a luminance is not uniform in an area where the luminance is not zero.

6. The method according to claim 4, wherein the illumination luminance distribution is a distribution at a position corresponding to a target pattern in an exposure area of the exposure apparatus.

7. The method according to claim 4, wherein
   a simulation is performed for correcting the mask data, the simulation using the calculated process parameter and the information including the non-uniformity in the illumination luminance distribution in the exposure apparatus, the exposure apparatus being used when the photomask is used in the photolithography process, the photomask being generated by using the corrected mask data.

8. The method according to claim 7, wherein the information including the non-uniformity in the illumination luminance distribution is a measurement value or a process value of the measurement value.

9. The method according to claim 7, the illumination luminance distribution is a distribution at a position corresponding to a mask correction target in an exposure area of the exposure apparatus.

10. A photomask manufacturing method of manufacturing a photomask from mask data corrected in a method of claim 4.

11. A semiconductor device manufacturing method of manufacturing a semiconductor device by using a photomask manufactured from the method of claim 10.

12. A semiconductor device manufacturing method of manufacturing a semiconductor device by using mask data corrected in a mask data correction method of claim 4.

13. A photomask manufacturing method of manufacturing a photomask from mask data corrected in a method of claim 1.

14. A semiconductor device manufacturing method of manufacturing a semiconductor device by using a photomask manufactured from the method of claim 13.

15. A semiconductor device manufacturing method of manufacturing a semiconductor device by using mask data corrected in a mask data correction method of claim 1.

16. A computer-readable medium embodying a computer program that, when executed, causes a computer to perform a mask data correction method used when forming a photomask used in a photolithography process, the method comprising:

obtaining a process parameter which represents an effect of a resist process on the basis of a first simulation performed by using information including a non-uniformity in an illumination luminance distribution in a first exposure apparatus; and correcting mask data on the basis of a second simulation performed by using the process parameter and information including a non-uniformity in an illumination luminance distribution in a second exposure apparatus.

17. The computer-readable medium according to claim 16, wherein obtaining the process parameter comprises:

forming a resist pattern in a lithography process;

measuring a shape of the resist pattern;

performing the first simulation by using the information including the non-uniformity in the illumination luminance distribution in the first exposure apparatus; and calculating the process parameter of the first simulation in which a pattern dimensional value obtained by the first simulation is closest to the measurement value in the measurement.

* * * * *

UNITED STATES PATENT AND TRADEMARK OFFICE
CERTIFICATE OF CORRECTION

PATENT NO. : 7,685,556 B2  Page 1 of 1
APPLICATION NO. : 11/062437
DATED : March 23, 2010
INVENTOR(S) : Fukuhara et al.

It is certified that error appears in the above-identified patent and that said Letters Patent is hereby corrected as shown below:

Claim 1, column 15, line 60, change "by processor" to --by the processor--.

Signed and Sealed this

First Day of June, 2010

David J. Kappos
*Director of the United States Patent and Trademark Office*